(12) United States Patent
Zhu

(10) Patent No.: US 11,011,813 B2
(45) Date of Patent: May 18, 2021

(54) POWER AMPLIFIER WITH SHIELDED TRANSMISSION LINES

(71) Applicant: NXP B.V., Eindhoven (NL)

(72) Inventor: Ning Zhu, Chandler, AZ (US)

(73) Assignee: NXP B.V., Eindhoven (NL)

( * ) Notice: Subject to any disclaimer, the term of this patent is extended or adjusted under 35 U.S.C. 154(b) by 54 days.

(21) Appl. No.: 16/510,604

(22) Filed: Jul. 12, 2019

(65) Prior Publication Data

US 2021/0013572 A1    Jan. 14, 2021

(51) Int. Cl.

| | |
|---|---|
| H03F 3/21 | (2006.01) |
| H03F 3/19 | (2006.01) |
| H03F 1/02 | (2006.01) |
| H01L 23/522 | (2006.01) |
| H01L 23/498 | (2006.01) |
| H01P 3/08 | (2006.01) |
| H03H 7/38 | (2006.01) |

(52) U.S. Cl.
CPC ........ H01P 3/082 (2013.01); H01L 23/49822 (2013.01); H01L 23/49827 (2013.01); H01L 23/5226 (2013.01); H03F 1/0288 (2013.01); H03F 3/19 (2013.01); H03F 3/21 (2013.01); H03H 7/38 (2013.01)

(58) Field of Classification Search
CPC .............. H01P 3/082; H01L 23/49827; H01L 23/5226; H01L 23/49822; H03H 7/38; H03F 3/19; H03F 1/0288; H03F 3/21
USPC ................................ 330/295, 124 R, 286, 84
See application file for complete search history.

(56) References Cited

U.S. PATENT DOCUMENTS

| | | | | |
|---|---|---|---|---|
| 5,568,086 | A | * 10/1996 | Schuss | .................. H03F 1/0288 330/107 |
| 7,688,135 | B2 | * 3/2010 | Kim | ........................ H03F 3/607 330/124 R |
| 8,890,302 | B2 | 11/2014 | Kong et al. | |
| 9,401,342 | B2 | * 7/2016 | Meen Kuo | .............. H01L 24/49 |
| 9,450,547 | B2 | * 9/2016 | Szymanowski | ... H01L 23/49575 |
| 9,607,953 | B1 | * 3/2017 | Li | ........................... H01L 23/16 |
| 10,573,594 | B2 | * 2/2020 | Aaen | ................ H01L 23/49506 |
| 2016/0150632 | A1 | 5/2016 | Viswanathan et al. | |

(Continued)

FOREIGN PATENT DOCUMENTS

| | | |
|---|---|---|
| EP | 2806557 A1 | 11/2014 |
| JP | 2013-85179 A | 5/2013 |

OTHER PUBLICATIONS

Hettak, K. et al., "A New Compact 3D SiGe 90° Hybrid Coupler using the Meandering TFMS and Shielded Strip Line at 20 GHz", Proceddings of the 39th European Microwave Conference, Sep. 29, 2009, pp. 1163-1166, IEEE, Piscataway, NJ, USA.

(Continued)

*Primary Examiner* — Hieu P Nguyen

(57) ABSTRACT

A power amplifier module includes a first phase shifter, a second phase shifter, and an electromagnetic shield. The first phase shifter includes a first transmission line assembly to shift a first amplified signal by a first phase angle. The second phase shifter includes a second transmission line assembly to shift a second amplified signal by a second phase angle. The electromagnetic shield is arranged to shield the first transmission line assembly from the second transmission line assembly. The power amplifier module may have, for example, Doherty amplifier configuration.

23 Claims, 6 Drawing Sheets

(56) References Cited

U.S. PATENT DOCUMENTS

2016/0226450 A1    8/2016  Ma et al.
2018/0131329 A1    5/2018  Tong
2018/0175799 A1    6/2018  Wu et al.

OTHER PUBLICATIONS

Lv, Guansheng et al., "A Compact Ka/Q Dual-Band GaAs MMIC Doherty Power Amplifier With Simplified Offset Lines for 5G Applications", IEEE Transactions on Microwave Theory and Techniques, Jul. 1, 2019, pp. 3110-3121, vol. 67, No. 7, IEEE, Piscataway, NJ, USA.

* cited by examiner

POWER AMPLIFIER WITH SHIELDED TRANSMISSION LINES

TECHNICAL FIELD

Example embodiments disclosed herein relate generally to power amplification.

BACKGROUND

Power amplifiers are used in a variety of applications. In a wireless communication system, a power amplifier generates amplified radio frequency signals to an antenna for communicating information such as calls and data. In terms of performance, a power amplifier may operate at maximum power efficiency when transmitting at or near saturated power. However, power efficiency tends to worsen as output power decreases.

Recently, the Doherty amplifier architecture has been the focus of attention to support wireless communications. A Doherty power amplifier may use strategies that differ, for example, based on phase difference between carrier (or "main") and peaking power amplifiers. One type of Doherty power amplifier uses a 90/0 strategy, where a 90 degree phase shift is applied to the peaking signal prior to amplification along the peaking amplifier path, and a corresponding 90 degree phase shift and impedance inversion is applied to the carrier signal after amplification along the carrier amplifier path and before the amplified carrier and peaking signals are combined together in phase at a combining node. However, a 90/0Doherty power amplifier has narrowband performance and therefore is unable to satisfy the requirements of many applications.

Another type of Doherty power amplifier uses a 90/180 strategy, which provides broader RF bandwidth. However, a 90/180 Doherty power amplifier as currently designed is unsuitable for use in the limited space available in a power amplifier module. Adding lumped components may help save space in certain circumstances to achieve 90/180 Doherty power amplifier, but not without a tradeoff in efficiency.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
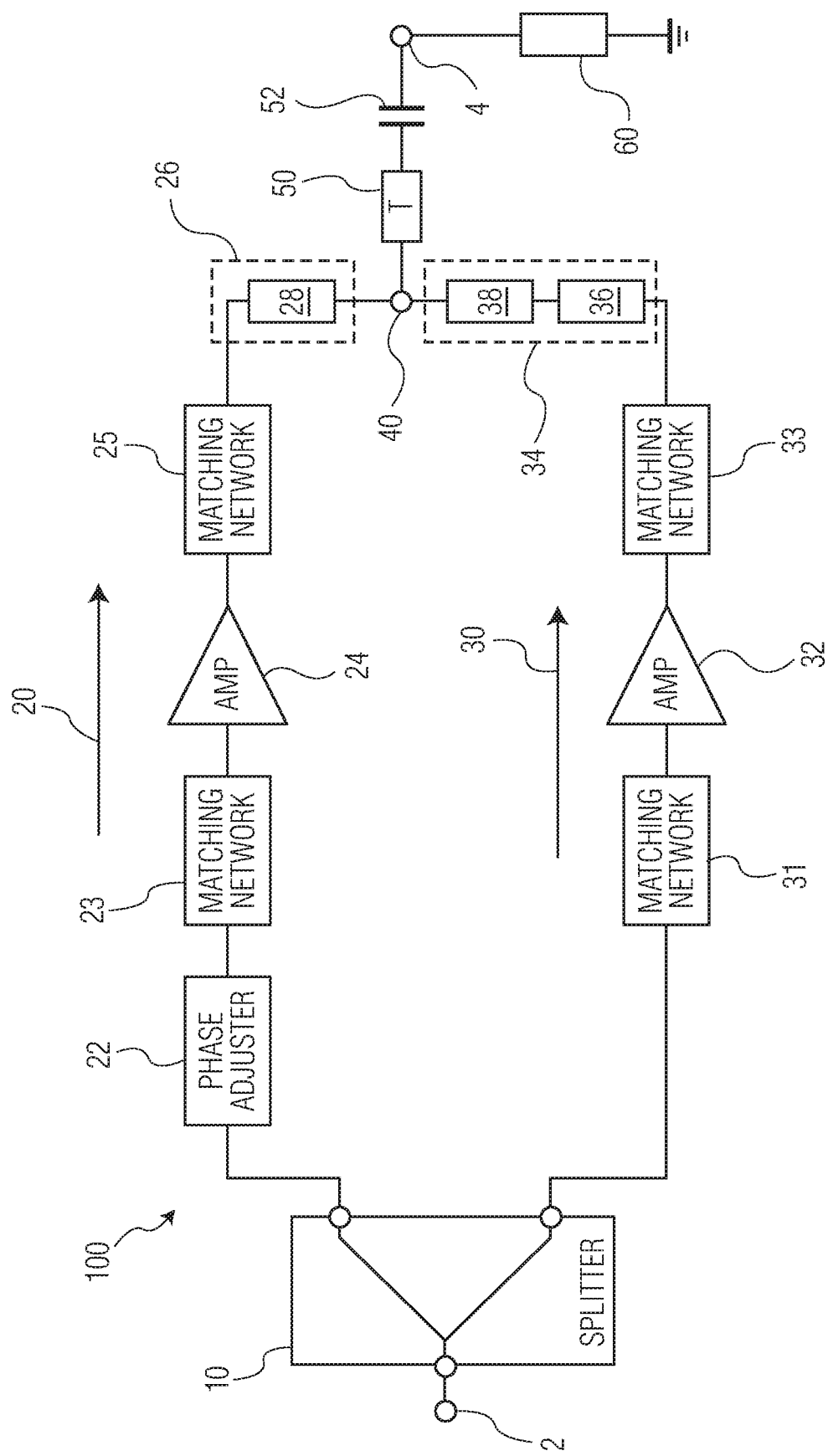
FIG. 1 illustrates a schematic diagram of an embodiment of a Doherty power amplifier.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Example embodiments describe a unique wideband power amplifier having a Doherty configuration that uses hybrid transmission lines and shielding structures. Such a power amplifier may be efficiently implemented within the limited space of a module platform and is suitable for use in many applications. In one embodiment, the power amplifier has a 90/180 Doherty configuration that demonstrates high efficiency across a wide band of frequencies. The combining node impedance of this power amplifier may be selected, for example, as 50Ω and may be implemented without an impedance transformer found in many other designs. The amplifier may also decrease dispersion and reduce or eliminate the use of lumped components.

FIG. 1 illustrates a schematic diagram of an embodiment of a Doherty power amplifier 100 in which embodiments of shielding structures may be implemented, as described later. In one embodiment, the Doherty power amplifier 100 is implemented as a module (e.g., module 200, FIGS. 2, 3, 6) in which the various components of the Doherty amplifier are integrated within or coupled to a module substrate (e.g., substrate 202, 700, FIGS. 2, 3, 6, 7).

Doherty amplifier 100 includes an input node 2, an output node 4, a power divider 10 (or splitter), a main amplifier path 20 (or "first signal path"), a peaking amplifier path 30 (or "second signal path"), and a combining node 40. A load 60 (e.g., an antenna) may be coupled to the combining node 40 through an impedance transformer 50 and a DC blocking capacitor 52, in an embodiment. The impedance transformer 50 may impart a 90 degree phase delay to the output RF signal before it is supplied to the load 60. The DC blocking capacitor 52 may perform a high-pass filter operating, passing higher frequency (AC) portions of the amplified signal and blocking lower frequency (DC) portions of the amplified signal. One or more additional capacitors may be coupled to the input and/or output of the package of the power amplifier module for RF impedance matching.

The main amplifier path 20 includes phase delay element 22, input matching network 23, a main amplifier stage 24, an output matching network 25, and a first transmission line assembly 26. The peaking amplifier path 30 includes input matching network 31, a peaking amplifier stage 32, an output matching network 33, and a second transmission line assembly 34. Essentially, the power divider 10 divides an input RF signal supplied at the input node 2, and the divided signals are separately amplified along the main and peaking amplifier paths 20, 30. The amplified signals are then combined in phase at the combining node 40. It is important that phase coherency between the main and peaking amplifier paths 20, 30 is maintained across a frequency band of interest to ensure that the amplified main and peaking signals arrive in phase at the combining node 40, and thus to ensure proper Doherty amplifier operation.

Each of the main amplifier 24 and the peaking amplifier 32 includes one or more single stage or multiple-stage power transistor integrated circuits (ICs) for amplifying an RF signal conducted through the amplifier 24, 32. Although the main and peaking power transistor ICs may be of equal size (e.g., in a symmetric Doherty configuration), the main and peaking power transistor ICs may have unequal sizes, as well (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 100, main amplifier stage 24 is biased to operate in class AB mode, and peaking amplifier stage 32 is biased to operate in class C mode. More specifically, the transistor arrangement of main amplifier stage 24 is biased to provide a conduction angle between 180 and 360 degrees. Conversely, the transistor arrangement of the peaking amplifier stage 32 is biased to provide a conduction angle less than 180 degrees.

At low power levels, where the power of the input signal at node 2 is lower than the turn-on threshold level of peaking amplifier 32, the amplifier 100 operates in a low-power (or back-off) mode in which the main amplifier 24 is the only amplifier supplying current to the load 60. When the power of the input signal exceeds a threshold level of the peaking amplifier 32, the amplifier 100 operates in a high-power mode in which the main amplifier 24 and the peaking amplifier 32 both supply current to the load 60. At this point, the peaking amplifier 32 provides active load modulation at combining node 40, allowing the current of the main amplifier 24 to continue to increase linearly.

Power divider 10 is configured to divide the input power of an RF input signal received at input 2 into main and peaking portions of the input signal. The main input signal is provided to the main amplifier path 20 at a first power divider output, and the peaking input signal is provided to the peaking amplifier path 30 at a second power divider output. During operation in a full-power mode when both the main and peaking amplifiers 24, 32 are supplying current to the load 60, the power divider 10 divides the input signal power between the amplifier paths 20, 30. For example, the power divider 10 may divide the power equally, such that roughly one half of the input signal power is provided to each path 20, 30 (e.g., for a symmetric Doherty amplifier configuration). Alternatively, the power divider 10 may divide the power unequally (e.g., for an asymmetric Doherty amplifier configuration).

Input and output impedance matching networks 23, 25 (input MNm, output MNm) may be implemented at the input and/or output of the main amplifier 24. Similarly, input and output impedance matching networks 31, 33 (input MNp, output MNp) may be implemented at the input and/or output of the peaking amplifier 32. In each case, the matching networks 23, 25, 31, 33 may be used to incrementally increase the circuit impedance toward the load impedance and source impedance. In addition, the main amplifier 24 and the peaking amplifier 32 may have additional pre-matching input and/or output impedance matching networks (not illustrated in FIG. 1) that are either integrated with the power transistor dies, or integrated within the power transistor die packages.

Doherty amplifier 100 has an "inverted" load network configuration, as compared to a conventional non-inverted Doherty amplifier. In the inverted configuration, the input circuit is configured so that an input signal supplied to the main amplifier 24 is delayed by 90 degrees with respect to the input signal supplied to the peaking amplifier 32 at the center frequency of operation, $f_0$, of the amplifier 100. For example, the 90 degree differential delay in the input circuit between the main and peaking paths 20, 30 may be imparted by a 90 degree phase delay element 22 in the main amplifier path 20. For example, phase delay element 22 may be a quarter wave transmission line, or another suitable type of delay element with an electrical length of about 90 degrees. Alternatively, the power divider 10 and the phase delay element 22 may be replaced with a hybrid power splitter (not illustrated), which outputs main and peaking signals with the desired 90 degree phase difference.

In accordance with the principles of operation of the "inverted" Doherty amplifier 100 and in order to establish the correct load modulation characteristic, the main output path (i.e., the transmission path between the output of amplifier 24 and combining node 40) including first transmission line assembly 26, output matching network 25, and any output pre-match within main amplifier device 24 is configured to impart a total phase delay of about 90 degrees on the amplified RF signal conveyed through the main output path. In addition, the peaking output path (i.e., the transmission path between the output of amplifier 32 and combining node 40) including second transmission line assembly 34, output matching network 33, and any output pre-match within peaking amplifier device 32 is configured to impart a total phase delay of about 180 degrees on the amplified RF signal conveyed through the peaking output path. Accordingly, Doherty amplifier 100 may be referred to as a 90/180 Doherty power amplifier. As discussed above, the main amplifier input path (i.e., the transmission path between the first output of splitter 10 and the input to the main amplifier 24) applies about a 90 degree phase delay to the input RF signal prior to reaching the input of main amplifier 24 to compensate for the 90 degree phase delay difference between the main and peaking amplifier output paths (i.e., to ensure that the amplified signals arrive in phase at the combining node 40).

The amplifier 24 may include a power transistor having an input (or control) terminal (e.g., a gate terminal) coupled through phase delay element 22 to splitter 10, a first current-conducting terminal (e.g., a source terminal) coupled to a reference potential (e.g., ground), and a second current-conducting terminal (e.g., a drain) coupled to the first transmission line assembly 26. Similarly, the amplifier 32 may include a power transistor having an input (or control) terminal (e.g., a gate terminal) coupled to splitter 10, a first current-conducting terminal (e.g., a source terminal) coupled to a reference potential (e.g., ground), and a second current-conducting terminal (e.g., a drain) coupled to the second transmission line assembly 34. For example, the power transistors may include silicon-based field effect transistors (FETs), such as laterally-diffused metal oxide semiconductor (LDMOS) FETs, gallium nitride FETs, and/or gallium arsenide FETs, to name a few.

The first transmission line assembly 26 includes, in this embodiment, only one transmission line 28 (TL1) that shifts the phase of the amplified carrier signal by a predetermined angle. The signal output from the transmission line assembly 26, thus, represents the amplified carrier signal which has been shifted in phase by both the phase adjuster 22 and the transmission line assembly 26. Because the phase adjuster 22 adjusted the phase of the carrier signal input into the power transistor 24, the total phase shift of the signal input into the combiner 40 from the first signal path 20 includes the sum of the phase shift imposed by the phase adjuster 22 and the phase shift imposed by the transmission line assembly 26.

The second transmission line assembly 34 may include multiple transmission lines, such as transmission line 36 (TL2) and transmission line 38 (TL3) connected in series. The transmission line 36 may shift the phase of the amplified peaking signal by a first predetermined angle, and the transmission line 38 may shift the phase of the amplified peaking signal output from transmission line 36 by a second predetermined angle. The first and second predetermined angles may be the same or different. Also, the sum of the first and second predetermined angles may be different from the phase angle shift imposed by the first transmission line assembly 28 in the carrier signal path. While the transmission line assembly 34 is illustrated to include two transmission lines 36 and 38 connected in series, in another embodiment the second transmission line assembly 34 may include only one transmission line which shifts the amplified peaking signal by a phase angle equal to a sum of the phase angles imposed by transmission lines 36 and 38. The signal output from the second transmission line assembly 34, thus, represents the amplified peaking signal shifted in phase based on a sum of the phase angles corresponding to transmission lines 36 and 38.

In one embodiment, the power amplifier module has a Doherty 90/180 configuration, where the first transmission line assembly (e.g., transmission line 28), plus other delay components between the intrinsic drain of amplifier 24 and the combining node 40, shifts the phase of the amplified carrier signal by about 90°, and the second transmission line assembly (e.g., transmission line 36 and 38 together), plus other delay components between the intrinsic drain of amplifier 32 and the combining node 40, shift the phase of the amplified peaking signal by about 180°.

In order to further improve performance, the impedance values of all three transmission lines 28, 36, and 38 may be selected to achieve impedance matching among them. For example, in order to achieve an output impedance that matches the input impedance of a load (e.g., $Z_{load}$=50Ω), the first transmission line (TL2) 36 may have a characteristic impedance of about 23Ω, the second transmission line (TL3) 38 may have a characteristic impedance of about 72Ω on the peaking signal path, and the transmission line 28 on the carrier signal path (TL1) may have a characteristic impedance of about 53Ω. The impedances may be achieved, at least in part, by varying the widths of the transmission lines, e.g., wider transmission lines may have less impedance, and vice versa.

The above-described Doherty power amplifier 100 has an inverted topology, as discussed above. In an alternate embodiment, Doherty power amplifier 100 may have a non-inverted Doherty topology, in which an opposite relationship between the delay elements in the main and peaking paths 20, 30 would apply. More specifically, in a non-inverted Doherty topology, phase delay element 22 would be implemented along the peaking input path, rather than the main input path. In addition, the main output path would include a total phase delay that compensates for the phase delay element 22 along the peaking input path. For example, the main output path may have a total phase delay of about 90 degrees, while the peaking output path may approximately have no phase delay (0 degrees).

Figure 2:
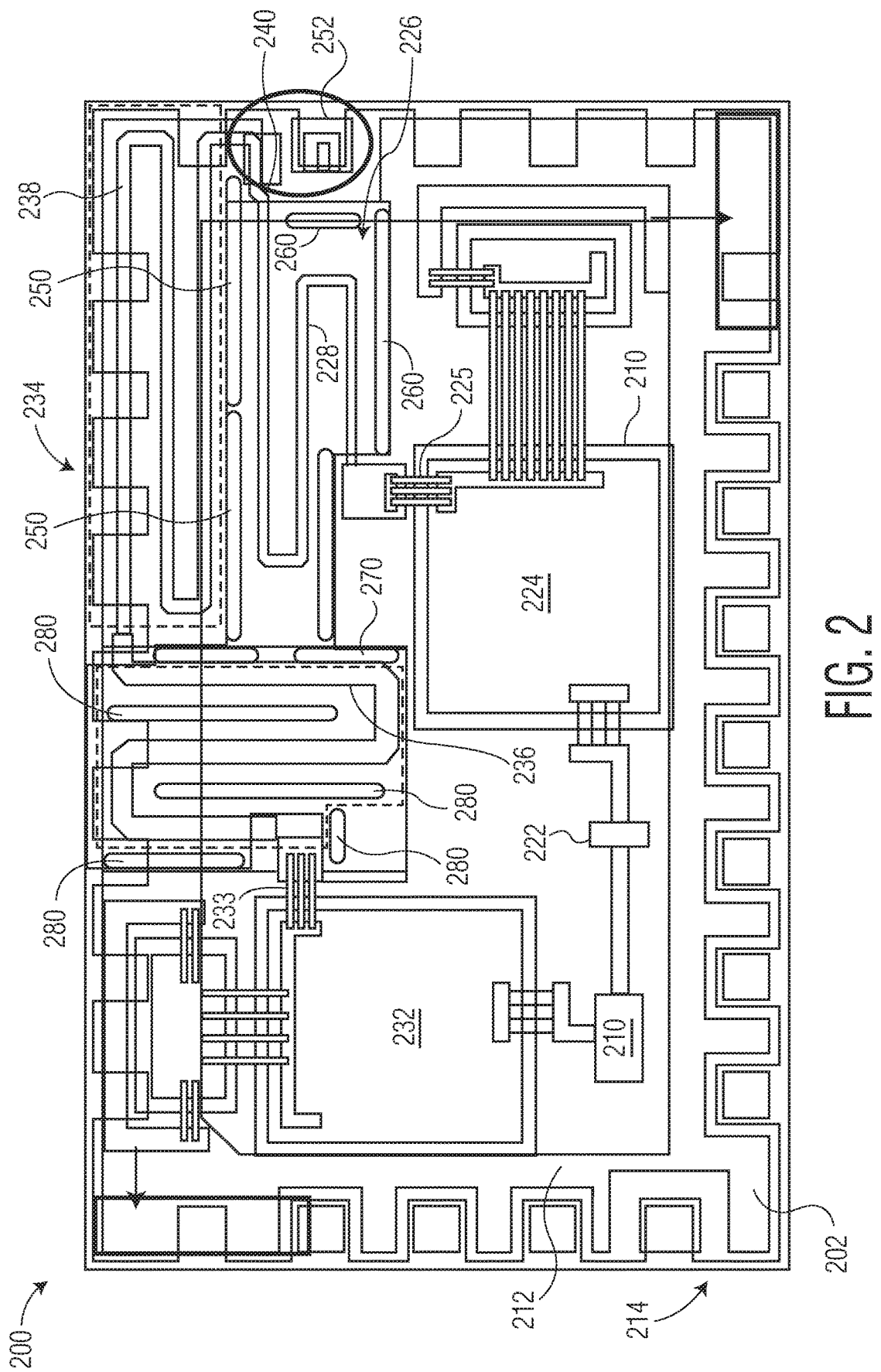
FIG. 2 illustrates a top view of an embodiment of a power amplifier module.
Figure 3:
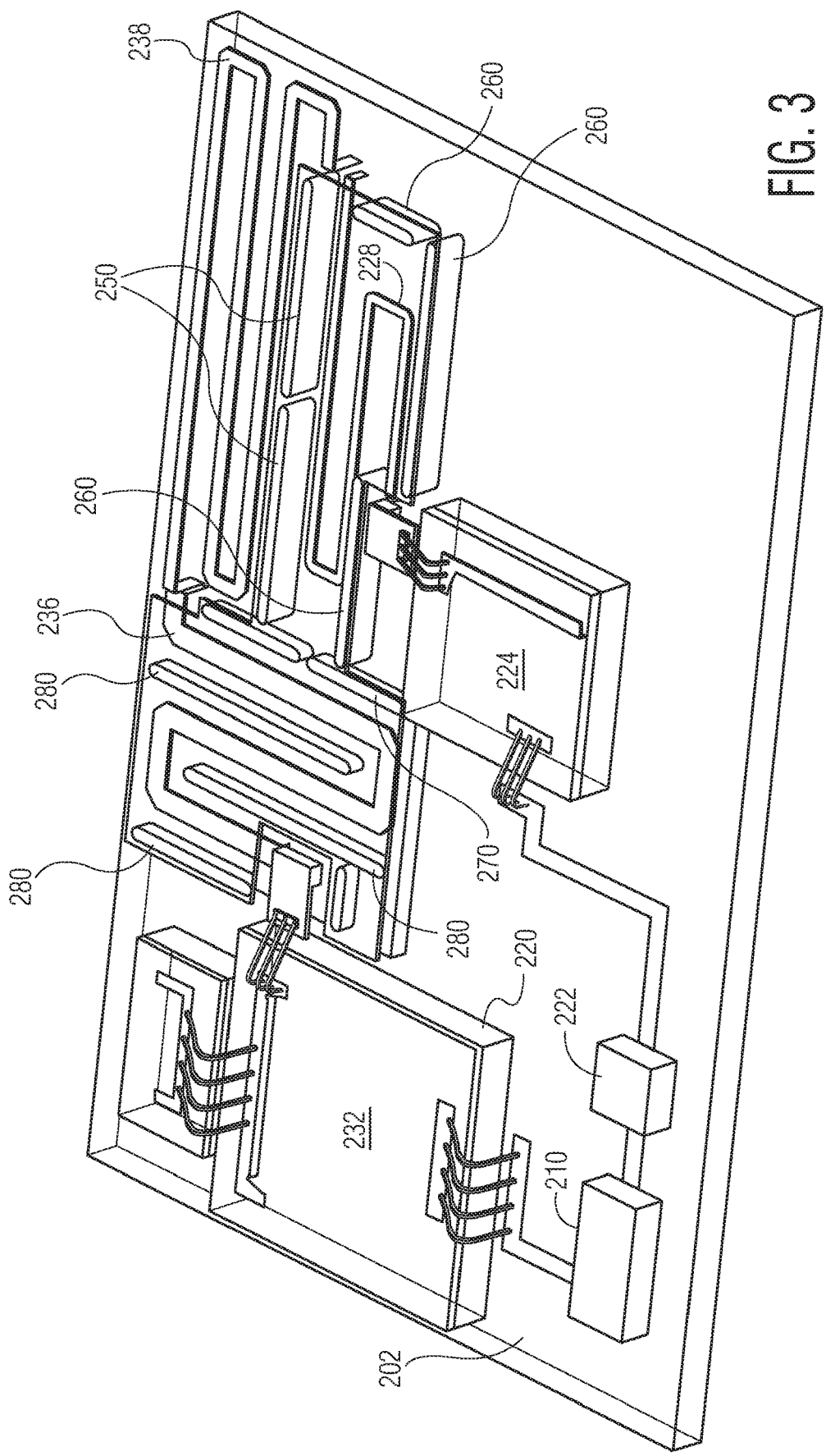
FIG. 3 illustrates another view of the power amplifier module of FIG. 2.

FIG. 2 illustrates a top view of an embodiment of a power amplifier module 200 that embodies the Doherty power amplifier 100 of FIG. 1, according to one embodiment, and FIG. 3 illustrates an additional view of the module 200 from a different perspective.

Power amplifier module 200 (or "Doherty amplifier module") includes a substrate 202, a power splitter 210 (e.g., power splitter 10, FIG. 1), a phase delay element 222 (e.g., phase delay element 22, FIG. 1), a carrier amplifier die 224 (e.g., carrier amplifier 24, FIG. 1), a peaking amplifier die 232 (e.g., peaking amplifier 32, FIG. 1), a first transmission line assembly 226 (e.g., first transmission line assembly 26, FIG. 1), a second transmission line assembly 234 (e.g., second transmission line assembly 34, FIG. 1), a combining node 240 (e.g., combining node 40, FIG. 1), and various other circuit elements, which will be discussed in more detail below.

The power amplifier module 200 may be implemented as a land grid array (LGA) module, for example. Accordingly, the substrate 202 has a component mounting surface 212 (also referred to herein as an "upper" or "top" surface) and a land surface 214 (also referred to herein as a "lower" or "bottom" surface). Conductive landing pads of the LGA are exposed at the land surface 214. Although module 200 is depicted as an LGA module, module 200 alternatively may be packaged as a pin grid array module, a quad flat no leads (QFN) module, or another type of package. Either way, the component mounting surface 212 and the components mounted to that surface 212 optionally may be covered with an encapsulant material (e.g., encapsulant material 730, FIG. 7, such as a plastic encapsulant). In an alternate embodiment, the components could be contained within an air cavity, which is defined by various structures (not illustrated) overlying the mounting surface 212.

According to an embodiment, the substrate 202 is relatively small, which provides for a particularly compact Doherty amplifier. For example, the component mounting surface 212 may have a width (horizontal dimension in FIG. 2) and a length (vertical dimension in FIG. 2) in a range of about 5 millimeters (mm) to about 20 mm, although the width and/or length may be smaller or larger, as well. In a particular embodiment, for example, the component mounting surface may have a width of about 10 mm and a length of about 6 mm.

A plurality of non-overlapping zones is defined at the mounting surface 212 of the substrate 202. Within an input signal and splitter zone, a conductive landing pad exposed at the land surface 214 is electrically coupled through the substrate 202 to a conductive contact at the mounting surface 212. The landing pad and contact, along with the electrical connections between them, function as the RF input node (e.g., RF input 2, FIG. 1) for the module 200.

The power splitter 210 is coupled to the mounting surface 212 in the input signal zone. According to an embodiment, the power splitter 210 may include one or more discrete die and/or components, although it is represented in FIG. 2 as a single element. The power splitter includes an input terminal and two output terminals. The input terminal is electrically coupled to the RF input node to receive an input RF signal. The output terminals are electrically coupled to conductive traces on the mounting surface 212, which connect the output terminals to inputs (e.g., gate terminals) of the carrier and peaking amplifier die 224, 232.

The power splitter 210 is configured to split the power of the input RF signal received through input terminal into first and second RF signals (e.g., carrier and peaking signals), which are produced at the output terminals. In addition, the power splitter 210 may include one or more phase shift elements configured to impart about a 90-degree phase difference between the first and second RF signals provided at output terminals. Alternatively, a phase delay element 222 (e.g., phase delay element 22, FIG. 1) may be provided along the path between one of the power splitter output terminals and the input to the carrier amplifier die 224.

The first and second RF signals may have equal or unequal power, as discussed previously. The first RF signal produced at the first output terminal is amplified through a carrier amplifier path (e.g., carrier path 20, FIG. 1). The carrier amplifier path includes the carrier amplifier die 224 and the first transmission line assembly 226.

Each of the transistors 224, 232 may be a field effect transistor (FET) (such as a metal oxide semiconductor FET (MOSFET), a laterally diffused MOSFET (LDMOS FET), a high electron mobility transistor (HEMI), and so on). Alternatively, each of the transistors 224, 232 may be a bipolar junction transistor (BJT). References herein to a "gate," "drain," and "source," which are commonly used to describe FETs, are not intended to be limiting, as each of these designations has analogous features for BJT implementations. In various embodiments, the semiconductor substrates on which transistors 224, 232 are formed may comprise silicon, silicon-on-insulator (SOI), silicon-on-sapphire (SOS), gallium arsenide (GaAs), gallium nitride (GaN), GaN on silicon carbide, GaN on silicon, or other types of substrate materials.

An amplified RF carrier signal is produced by the carrier amplifier die 224 at an RF output terminal of die 224 (e.g., drain terminal). Additionally, an amplified RF peaking signal is produced by the peaking amplifier die 232 at an RF output terminal of die 232 (e.g., drain terminal).

Through wirebond array 225 (or another conductive connection), a first end of the first transmission line assembly 226 (e.g., first transmission line assembly 26) is electrically connected to the output terminal (e.g., drain terminal) of the carrier amplifier die 224. A second end of the first transmission line assembly 226 is electrically connected to the combining node 240. Similarly, through another wirebond array 233 (or another conductive connection), a first end of the second transmission line assembly 234 (e.g., second transmission line assembly 26) is electrically connected to the output terminal (e.g., drain terminal) of the peaking amplifier die 232. A second end of the second transmission line assembly 234 also is electrically connected to the combining node 240.

The first transmission line assembly 226 includes a first transmission line 228 (e.g., transmission line 28, FIG. 1). According to an embodiment, the first transmission line 228 is implemented with a transmission line (e.g., a shielded stripline, as described in conjunction with FIG. 4) having an electrical length of less than lambda/4 ($\lambda$/4) (e.g., less than 90 degrees), where lambda corresponds to the wavelength of a center frequency within a bandwidth of operation of the amplifier embodied in module 200.

The second transmission line assembly 234 includes a second transmission line 236 and a third transmission line 238 (e.g., transmission lines 36, 38, FIG. 1) coupled in series. More specifically:
- a first end of the second transmission line 236 (corresponding to a first end of the second transmission line assembly 234) is coupled to the output terminal (e.g., drain terminal) of the peaking amplifier die 232;
- a second end of the second transmission line 236 is coupled to a first end of the third transmission line 238; and
- a second end of the third transmission line 238 (corresponding to a second end of the second transmission line assembly 234) is coupled to the combining node 240.

Figure 4:
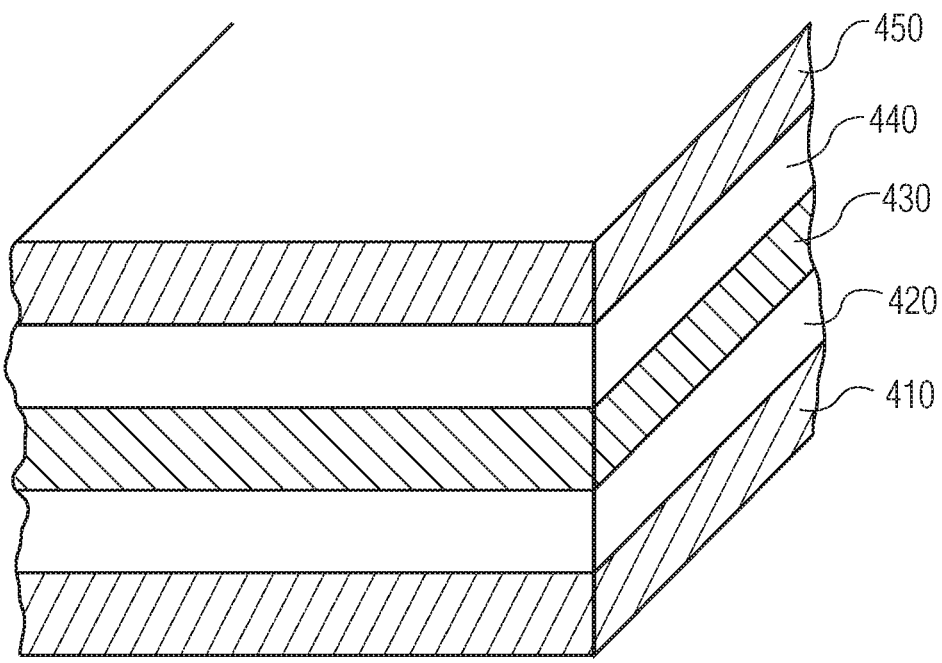
FIG. 4 illustrates a cross-sectional view of an embodiment of a stripline transmission line.
Figure 5:
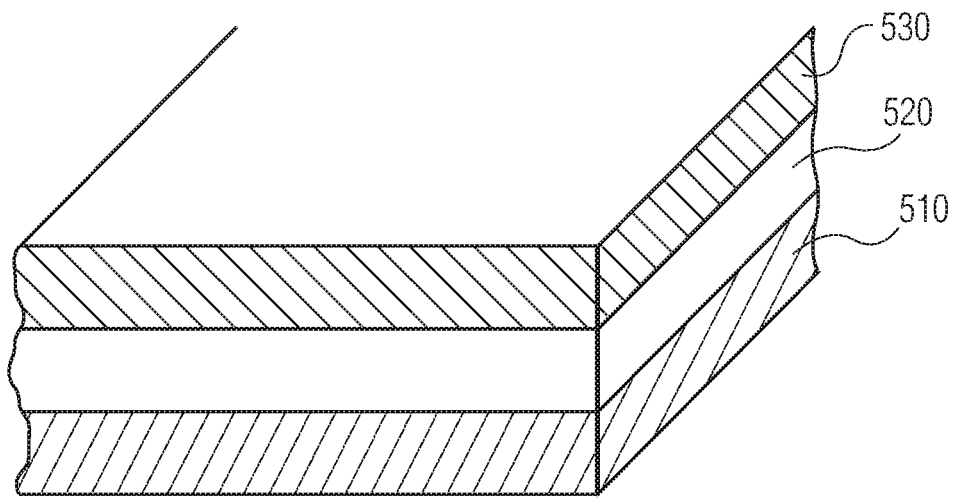
FIG. 5 illustrates a cross-sectional view of an embodiment of a microstrip transmission line.

According to an embodiment, the second transmission line 236 is implemented with a first type of transmission line (e.g., a shielded stripline, as described in conjunction with FIG. 4), and the third transmission line 238 is implemented with a second type of transmission line (e.g., a microstrip transmission line, as described in conjunction with FIG. 5). A combined electrical length of the second and third transmission lines 236, 238 is less than lambda/2 ($\lambda$/2) (e.g., less than 180 degrees), in an embodiment. In some embodiments, the second and third transmission lines 236, 238 have approximately equal electrical lengths. In other embodiments, the second transmission line 236 may provide between 25% and 75% of the entire electrical length of the second transmission line assembly 234, and the third transmission line 238 may provide a remainder of the entire electrical length of the second transmission line assembly 234.

Figure 7:
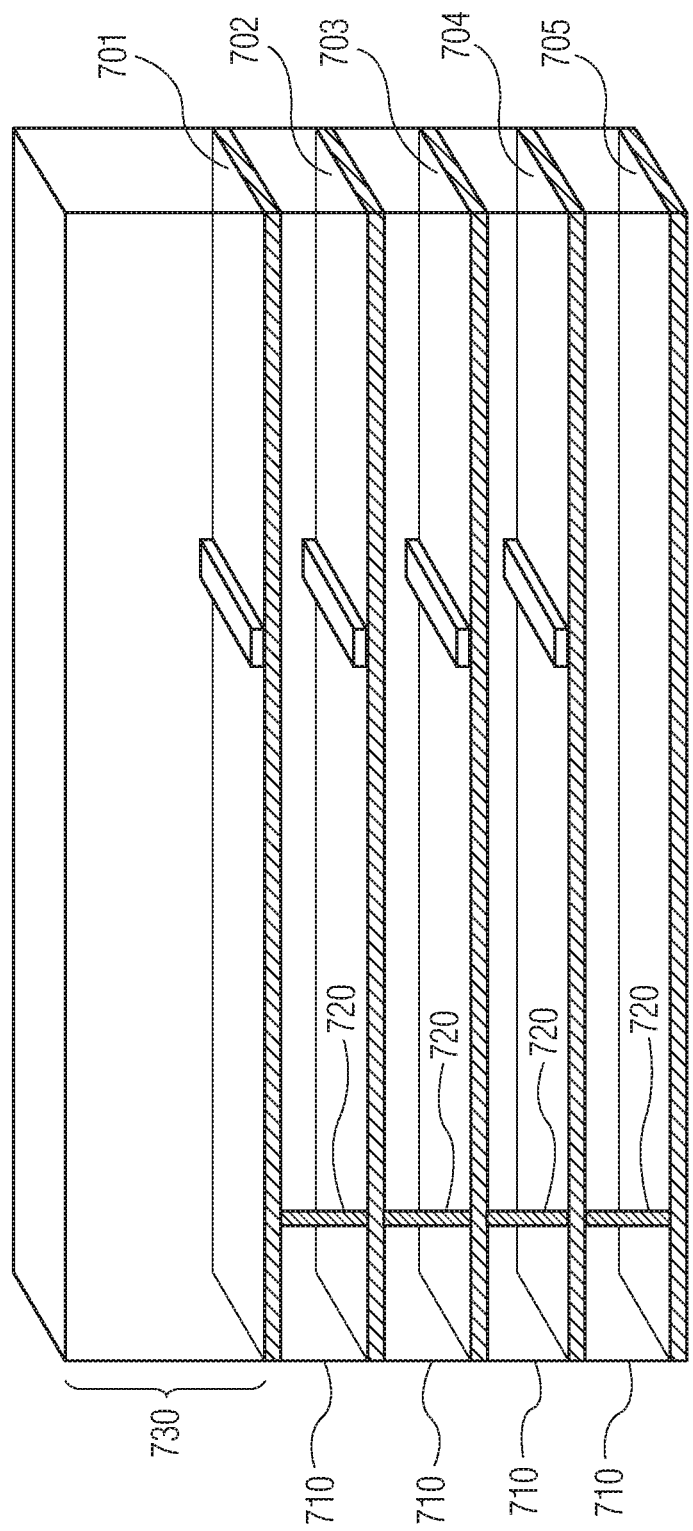
FIG. 7 illustrates a cross-sectional view of an embodiment of a substrate.

As indicated above, the transmission lines 228, 236, and 238 may be the same type or different types of transmission lines. In one embodiment, transmission lines 228 and 236 are shielded striplines and transmission line 238 is a microstrip transmission line. In another embodiment, the transmission lines may be a different combination of transmission line types. The transmission lines 228, 236, 238 are integrally formed with the module substrate 202 (e.g., substrate 700, FIG. 7), in an embodiment. Referring briefly to FIG. 7, substrate 700 (or substrate 202) includes a plurality of metal layers 701-705 with dielectric layers 710 interleaved between adjacent metal layers 701-705, and with conductive vias 720 electrically connecting portions of the metal layers 701-705. Particularly when they are of different transmission line types, the signal-carrying portions of the transmission lines 223, 236, 238 may be implemented on different metal layers. For example, the signal-carrying portion of a microstrip transmission line (e.g., transmission line 238) may be a patterned portion of metal layer 701, and the signal-carrying portion of a shielded stripline transmission line (e.g., transmission line 236) may be a patterned portion of metal layer 702 (to allow for a ground shield structure to be included at higher metal layer 701), and the signal-carrying portion of another shielded stripline transmission line (e.g., transmission line 228) may be a patterned portion of metal layer 703 (to allow for a ground shield structure to be included at higher metal layer 701). Electrically conductive vias (e.g., vias 720) can be used to electrically connect the transmission lines 228, 236, 238 when they are implemented on different metal layers. In alternate embodiments, the signal-carrying portions of the transmission lines 228, 236, 238 could be implemented on the same metal layer, as long as a ground shield structure can be formed over at least some of the transmission lines (e.g., the metal layer with the signal-carrying portions of the transmission lines 228, 236, 238 could be lower than layer 701 so that a portion of layer 701 can provide the ground shield structure).

In order to prevent mutual coupling among the transmission lines, the module 200 includes electromagnetic shielding. In a more specific embodiment, both the transmission lines 228, 236, 238 and the electromagnetic shielding are integrally formed with the module substrate 202 (e.g., substrate 700, FIG. 7). Referring briefly to FIG. 7, substrate 700 (or substrate 202) includes a plurality of metal layers 701-705 with dielectric layers 710 interleaved between adjacent metal layers 701-705, and with conductive vias 720 electrically connecting portions of the metal layers 701-705.

In the present embodiment, the signal carrying conductors of transmission lines 228, 236, and 238 have curved configurations in order to increase the line lengths to make the most efficient use of space in the package. For example, the first transmission line 228 includes a first plurality of series-connected transmission line segments that include first, second, and third elongated segments arranged in parallel with each other, and two 180 degree curved segments connecting the first and second elongated segment, and the second and third elongated segment, respectively. The second transmission line 236 includes a second plurality of series-connected transmission line segments that include fourth, fifth, and sixth elongated segments arranged in parallel with each other, two 180 degree curved segments connecting the fourth and fifth elongated segment, and the fifth and sixth elongated segment, respectively, and a 90 degree curved segment connected between the end of the sixth elongated segment and a first end of the third transmission line 238. Finally, the third transmission line 238 includes a third plurality of series-connected transmission line segments that include seventh, eighth, and ninth elongated segments arranged in parallel with each other, two 180 degree curved segments connecting the seventh and eighth elongated segment, and the eighth and ninth elongated segment, respectively, and a 90 degree curved segment connected between the end of the ninth elongated segment and the combining node 240.

As the below description will make more apparent, the signal carrying conductors for the second and third transmission lines 236, 238, which are electrically connected in series between first and second ends, may be implemented in different metal layers of substrate 202. Accordingly, one or more conductive vias may be used to electrically connect the second and third transmission lines 236, 238. As used herein, the "area" occupied by a transmission line 228, 236, 238 may be considered to be the two-dimensional area (e.g., plane/planes) that encompasses the plurality of series-connected transmission line segments for that transmission line 228, 236, 238. As shown in FIG. 2, the areas occupied by the transmission lines are generally non-overlapping and adjacent to each other, and at least some of the various conductive barriers 250, 270 discussed below are present in proximity to the boundaries between the areas occupied by the transmission lines 228, 236, 238.

The electromagnetic shielding includes a first conductive vertical barrier 250, a second conductive vertical barrier 260, a third conductive vertical barrier 270, and fourth conductive vertical barriers 280, where "vertical", as used herein, indicates a direction perpendicular to the page for FIG. 2 (conversely, "horizontal", as used herein, means a direction co-planar with the page for FIG. 2). Each of the barriers 250, 260, 270, 280 may be formed from conductive vias within the substrate 202. In addition to barriers 250, 260, 270, 280, the electromagnetic shielding may include patterned horizontal portions of one or more metal layers (e.g., patterned portions of layers 701, 702, or other layers). Additional barriers may be included to protect additional sides of the transmission lines and/or other features on the package.

The first barrier 250 is arranged between the transmission line 228 along the carrier signal path and the third transmission line 238 along the peaking signal path. According to an embodiment, the first barrier 250 is a vertical barrier that includes one or more conductive vias (e.g., vias through one or more dielectric layers 710 that interconnect portions of two metal layers (e.g., layers 701 and 703) or other sets of metal layers). The vias of the first barrier 250 may be trench vias, as best shown in FIG. 3, or the vias of the first barrier 250 may have another cross-section (e.g., round). Although not depicted in FIGS. 2, 3, the vias of the first barrier 250 are electrically coupled to a ground node (e.g., to a conductive ground node at the bottom surface 214 of substrate 202).

The second barrier 260 is arranged between the transmission line 228 and carrier amplifier die 224 including the power amplifier for the carrier signal, and also between transmission line 228 and the combining node 240 and capacitor 252 (e.g., capacitor 52, FIG. 1). According to an embodiment, the second barrier 260 also is a vertical barrier that includes one or more conductive vias (e.g., vias through one or more dielectric layers 710 that interconnect portions of two metal layers (e.g., layers 701 and 703) or other sets of metal layers). The vias of the second barrier 260 may be trench vias, as best shown in FIG. 3, or the vias of the second barrier 260 may have another cross-section (e.g., round). Although not depicted in FIGS. 2, 3, the vias of the second barrier 260 are electrically coupled to a ground node (e.g., to a conductive ground node at the bottom surface 214 of substrate 202).

The third barrier 270 is arranged between transmission lines 228 and 236, and also between transmission lines 236 and 238. According to an embodiment, the third barrier 270 also is a vertical barrier that includes one or more conductive vias (e.g., vias through one or more dielectric layers 710 that interconnect portions of two metal layers (e.g., layers 701 and 703) or other sets of metal layers). The vias of the third barrier 270 may be trench vias, as best shown in FIG. 3, or the vias of the third barrier 270 may have another cross-section (e.g., round). Although not depicted in FIGS. 2, 3, the vias of the third barrier 270 are electrically coupled to a ground node (e.g., to a conductive ground node at the bottom surface 214 of substrate 202).

The one or more fourth barriers 280 are arranged between parallel segments of the second transmission line 236, as described above, and also between the second transmission line 236 and the peaking amplifier die 232 including the power amplifier for the peaking signal. According to an embodiment, the fourth barriers 280 also are vertical barriers, each of which includes one or more conductive vias (e.g., vias through one or more dielectric layers 710 that interconnect portions of two metal layers (e.g., layers 701 and 703) or other sets of metal layers). The vias of the fourth barriers 280 may be trench vias, as best shown in FIG. 3, or the vias of the fourth barriers 280 may have another cross-section (e.g., round).

A portion of the barriers 280 may be interleaved between adjacent segments of the second transmission line 236 to provide improved electromagnetic shielding performance. Although not depicted in FIGS. 2, 3, the vias of the fourth barriers 280 are electrically coupled to a ground node (e.g., to a conductive ground node at the bottom surface 214 of substrate 202).

The barriers providing the electromagnetic shielding are shown as discrete assemblies arranged side-by-side. In another embodiment, each of the barriers may be formed as one continuous wall, or all of the barriers may be formed of just one continuous wall through bar vias or standard vias.

Figure 6:
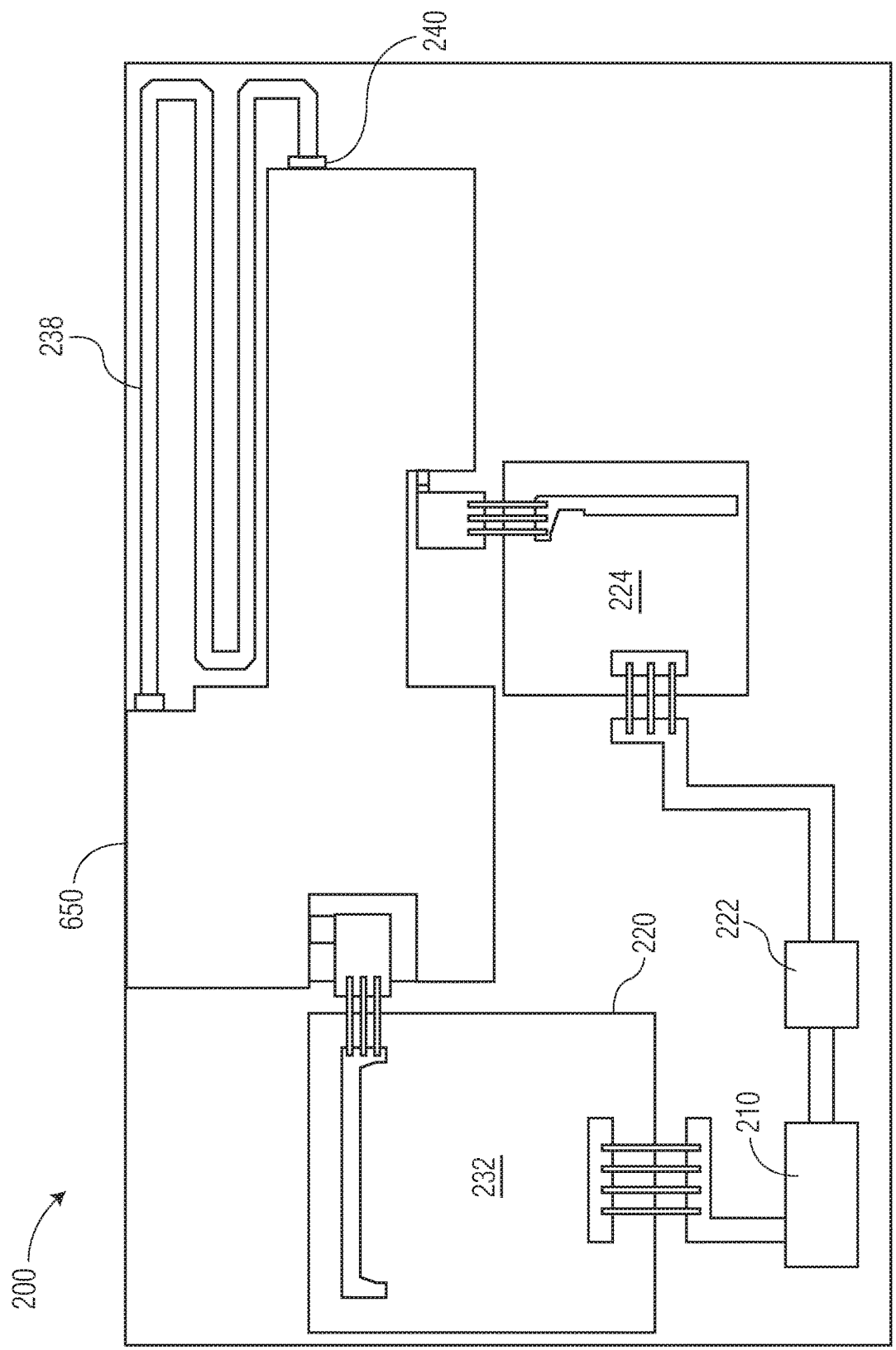
FIG. 6 illustrates a top view of the module of FIGS. 2 and 3, further illustrating an embodiment of electromagnetic shielding.

As best shown in FIG. 6, the electromagnetic shielding also includes patterned horizontal portions 650 of one or more metal layers, in addition to the barriers 250, 260, 270, 280. For example, transmission line 236 may be a shielded stripline, in an embodiment, which includes the transmission line 236 in one metal layer (e.g., metal layer 702, FIG. 7) and an electromagnetic shield that includes an overlying portion of a metal layer (e.g., metal layer 701, FIG. 7) and an underlying portion of a metal layer (e.g., metal layer 703), where the overlying and underlying portions of the metal layers are electrically connected by the conductive barriers 270, 280. Further, the overlying and underlying portions of the metal layers have areas that substantially cover the area occupied by the transmission line 236. Similarly, for example, transmission line 228 may be a shielded stripline, in an embodiment, which includes the transmission line 228 in one metal layer (e.g., metal layer 703, FIG. 7) and an electromagnetic shield that includes an overlying portion of a metal layer (e.g., metal layer 701, FIG. 7) and an underlying portion of a metal layer (e.g., metal layer 705), where the overlying and underlying portions of the metal layers are electrically connected by the conductive barriers 250, 260, 270. Further, the overlying and underlying portions of the metal layers have areas that substantially cover the area occupied by the transmission line 228. FIG. 6 illustrates the patterned horizontal portion 650 of a metal layer (e.g., layer 701, FIG. 7) overlying transmission lines 228, 236. A similarly-shaped, patterned horizontal portion of another metal layer (e.g., layer 703, FIG. 7) underlies the transmission lines 228, 236, and the overlying and underlying patterned metal layer portions are electrically connected through the conductive barriers 250, 260, 270, 280.

FIG. 4 illustrates an embodiment of a shielded stripline, e.g., transmission line 28 (TL1) and transmission line 36 (TL2). For a shielded stripline configuration (shown in cross-assembly), five layers may be used. The first layer 410 is a lower ground (metal) layer, the second layer 420 is a dielectric layer, the third layer 430 is a patterned, electrically conductive (metal) signal layer, the fourth layer 440 is another dielectric layer, and the fifth (metal) layer 450 is an upper ground (metal) layer. The signal layer 430 includes the metal pattern for the transmission line (e.g., TL1 and TL2). The dielectric layers are provided to prevent shorting between the transmission line layer 430 and the lower and upper ground layers 410, 450.

FIG. 5 illustrates an embodiment of microstrip transmission line, e.g., transmission line 38 (TL3). For a microstrip configuration (shown in cross-section), three layers may be used. The first layer 510 may be a lower ground (metal) layer, the second layer 520 may be a dielectric layer, and the third layer 530 may be a patterned, electrically conductive (metal) signal layer including the transmission line pattern. In this embodiment, additional dielectric and ground layers are not required. In the embodiments of FIGS. 4 and 5, the lower ground layers 410 and 510 may be the same layer and the dielectric layers 420 and 520 may be the same layers. Also, the signal layers 430 and 530 may be coplanar but include different metal patterns to correspond the different arrangements of transmission lines.

As referred to earlier, FIG. 6 illustrates an example configuration of a portion of the electromagnetic shielding in FIGS. 2, 3 from a plan (or top) view. The electromagnetic shielding illustrated in FIG. 6 shows the configuration of a patterned, conductive, upper shield or ground layer 650 (e.g., upper ground layer 450, FIG. 4) overlying the signal lines/layers of transmission line 28, 228 (TL1) and transmission line 36, 236 (TL2) when these transmission lines are implemented as shielded striplines. Microstrip transmission lines may not have an upper ground layer. Therefore, the signal line/layer of transmission line 238 (TL3) in FIG. 6 is visible in this view because it does not have an overlying upper shield or ground layer.

FIG. 7 illustrates an embodiment of a substrate 700 that may be used to implement shielded stripline and microstrip transmission lines within the package 200 of the power amplifier module. More specifically, FIG. 7 is a cross-sectional view of a substrate 700 (e.g., a printed circuit board, multi-layer ceramic substrate, or other suitable substrate) that supports and electrically connects the various components of the power amplifier module. Substrate 700 includes a plurality of metal layers 701, 702, 703, 704, 705 (or M1 to M5) with dielectric layers 710 (e.g., ceramic, FR-4, or other suitable materials) interleaved between adjacent metal layers 701-705. Although substrate 700 is shown to include five metal layers 701-705 and four interleaved dielectric layers 710, other embodiments of a substrate may include more or fewer metal and dielectric layers. Electrically-conductive vias 720 (only a few shown by way of example) extend through the dielectric layers 710 to electrically connect portions the metal layers 701-705, where needed. An additional dielectric 730, which may either be air or plastic encapsulation, for example, is adjacent to the top surface of the substrate 700.

The metal layers 701-705 may be arranged and patterned to implement transmission lines TL1, TL2, and TL3 (e.g., transmission lines 228, 236, 238, FIG. 2). For example, TL1 and TL2, which are shielded transmission lines, may include a patterned signal line implemented in a conductive signal layer (e.g., layer 430, FIG. 4), and patterned conductive shield structures implemented in conductive ground layers (e.g., layers 410, 450, FIG. 4) below and above the conductive signal layer. For example, in substrate 700, the patterned conductive shield structures may be implemented as portions of metal layers 701 and 703, and the patterned signal line may be implemented as a patterned portion of metal layer 702. The patterned conductive shield structures may be electrically connected together through vias 720, and additional vias 720 may be used to electrically connect the patterned conductive shield structures to the lowest metal layer 705 (e.g., a ground metal layer disposed on the bottom of substrate 700).

As a further example, TL3, which is a microstrip transmission line, may include a patterned signal line implemented in a conductive signal layer (e.g., layer 530, FIG. 5), and a conductive ground structure implemented in a conductive ground layer (e.g., layers 510, FIG. 5) below the conductive signal layer. For example, in substrate 700, the conductive ground structure may be implemented as metal layer 705, and the patterned signal line may be implemented as a patterned portion of metal layer 701. Although the above description indicates that the conductive signal lines and associated ground structures may be implemented in various metal layers, in other embodiments, the signal lines and ground structures may reside on different metal layers.

For further clarity of description, the below table provides examples of sets of metal layers (FIG. 7) that may be used to implement the first, second, and third transmission lines 28, 228, 36, 236, 38, 238. It should be understood that the table is provided for purposes of illustration and not by way of limitation, and that the various transmission lines could be implemented using different sets of layers than those listed below:

| Transmission Line | Signal Layer | Top Shield | Bottom Shield/ Ground Layer |
|---|---|---|---|
| TL1 (28, 228) | M3 (703) | M1 (701) | M5 (705) |
| TL2 (36, 236) | M2 (702) | M1 (701) | M3 (703) and lower |
| TL3 (38, 238) | M1 (701) | n/a | M5 (705) |

In accordance with one or more of the aforementioned embodiments, a power amplifier module includes a first phase shifter configured to shift a first amplified signal by a first phase angle, wherein the first phase shifter includes a first transmission line assembly, a second phase shifter configured to shift a second amplified signal by a second phase angle that is different from the first phase angle. The second phase shifter includes a second transmission line assembly, and an electromagnetic shield between the first and second phase shifters, wherein the electromagnetic shield is arranged to shield the first transmission line assembly from the second transmission line assembly.

The electromagnetic shield may include at least one vertical barrier. The at least one vertical barrier may include one or more dielectric layers interleaved between a plurality of metal layers. The plurality of metal layers may be electrically connected to at least one of the first transmission line assembly and the second transmission line assembly, and at least one of the plurality of metal layers includes or is connected to a ground layer.

The power amplifier module may include a number of conductive vias extending through the one or more dielectric layers to connect a first one of the metal layers to a second one of the metal layers. The first one of the metal layers may be connected to the first transmission line assembly and the second one of the metal layers may be connected to the second transmission line assembly. The second transmission line assembly may include a first and second transmission lines, the first one of the metal layers may be connected to the first transmission line, and the second one of the metal layers may be connected to the second transmission line.

The electromagnetic shield may include a patterned horizontal portion covering an area that includes at least one of the first transmission line assembly and the second transmission line assembly. The patterned horizontal portion may correspond to one of the metal layers of the at least one vertical barrier. The second transmission line assembly may include a first transmission line to shift the second amplified signal by a third phase angle, and a second transmission line to shift the second amplified signal by a fourth phase angle, wherein a sum of the third phase angle and the fourth phase angle may equal to the second phase angle. At least a portion of the electromagnetic shield may include a vertical barrier arranged to shield the first transmission line from the second transmission line.

The first transmission line may be a first type of transmission line and the second transmission line may be a second type of transmission line different from the first type of transmission line. The first transmission line assembly may include a transmission line of the first type. The first type may be a shielded stripline and the second type may be a microstrip.

In accordance with one or more other embodiments, a power amplifier module includes a first amplifier configured to amplify a first signal, a first transmission line assembly coupled to an output of the first amplifier, a second amplifier configured to amplify a second signal, a second transmission line assembly coupled to an output of the second amplifier, and an electromagnetic shield between the first transmission line assembly and the second transmission line assembly. The first transmission line assembly is configured to shift a phase of the first amplified signal by a first phase angle and the second transmission line assembly is configured to shift a phase of the second amplified signal by a second phase angle different from the first phase angle. The first amplifier may be arranged along a carrier signal path, the second amplifier may be arranged along a peaking signal path, and the carrier and peaking signal paths may be in a Doherty amplifier configuration.

The power amplifier module may include a phase adjuster configured to shift the first signal input into the first amplifier by a third phase angle, and a sum of the first phase angle and the third phase angle is substantially equal to the second phase angle. The first phase angle may be in a first range between 0° and 90°, and the second phase angle may be in a second range between 90° and 180°. The power amplifier module may include a combiner coupled to outputs of the first transmission line assembly and the second transmission line assembly. The first transmission line assembly may be coupled between the first amplifier and the combiner and the second transmission line assembly may be coupled between the second amplifier and the combiner.

The electromagnetic shield may include at least one vertical barrier. The at least one vertical barrier may include one or more dielectric layers interleaved between a plurality of metal layers. The plurality of metal layers may be electrically connected to at least one of the first transmission line assembly and the second transmission line assembly, and at least one of the plurality of metal layers may include or be connected to a ground layer. A number of conductive vias may extend through the one or more dielectric layers to connect a first one of the metal layers to a second one of the metal layers. The first one of the metal layers may be connected to the first transmission line assembly and the second one of the metal layers may be connected to the second transmission line assembly.

The second transmission line assembly may include a first and second transmission lines. The first one of the metal layers may be connected to the first transmission line, and the second one of the metal layers may be connected to the second transmission line. The electromagnetic shield may include a patterned horizontal portion covering an area that includes at least one of the first transmission line assembly and the second transmission line assembly. The patterned horizontal portion may correspond to one of the metal layers of the at least one vertical barrier.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

I claim:

1. A power amplifier module, comprising:
a module substrate that includes a plurality of metal layers and a plurality of dielectric layers interleaved between the plurality of metal layers;
a first phase shifter configured to shift a first amplified signal by a first phase angle, wherein the first phase shifter includes a first transmission line assembly that is integrally formed with the module substrate from one or more first patterned portions of one or more of the plurality of metal layers;
a second phase shifter configured to shift a second amplified signal by a second phase angle that is different from the first phase angle, wherein the second phase shifter includes a second transmission line assembly that is integrally formed with the module substrate from one or more second patterned portions of one or more of the plurality of metal layers; and
an electromagnetic shield between the first and second phase shifters and integrally formed with the module substrate, wherein the electromagnetic shield includes at least one conductive vertical barrier that extends through at least one of the plurality of dielectric layers between adjacent metal layers, and wherein the electromagnetic shield is arranged to shield the first transmission line assembly from the second transmission line assembly.

2. The power amplifier module of claim 1, wherein the second transmission line assembly includes:
a first transmission line to shift the second amplified signal by a third phase angle, and
a second transmission line to shift the second amplified signal by a fourth phase angle,
wherein a sum of the third phase angle and the fourth phase angle is equal to the second phase angle.

3. The power amplifier module of claim 2, wherein:
the first transmission line is a first type of transmission line, and
the second transmission line is a second type of transmission line different from the first type of transmission line.

4. The power amplifier module of claim 3, wherein the first transmission line assembly includes a transmission line of the first type.

5. The power amplifier module of claim 4, wherein the first type is a shielded stripline and the second type is a microstrip.

6. A power amplifier module, comprising:
a first phase shifter configured to shift a first amplified signal by a first phase angle, wherein the first phase shifter includes a first transmission line assembly;
a second phase shifter configured to shift a second amplified signal by a second phase angle that is different from the first phase angle, wherein the second phase shifter includes a second transmission line assembly; and
an electromagnetic shield between the first and second phase shifters, wherein the electromagnetic shield is arranged to shield the first transmission line assembly from the second transmission line assembly, and wherein the electromagnetic shield includes at least one vertical barrier, the at least one vertical barrier including one or more dielectric layers interleaved between a plurality of metal layers, the plurality of metal layers electrically connected to at least one of the first transmission line assembly and the second transmission line assembly and at least one of the plurality of metal layers includes or is connected to a ground layer.

7. The power amplifier module of claim 6, further comprising:
a number of conductive vias extending through the one or more dielectric layers to connect a first one of the metal layers to a second one of the metal layers.

8. The power amplifier module of claim 7, wherein the first one of the metal layers is connected to the first transmission line assembly and the second one of the metal layers is connected to the second transmission line assembly.

9. The power amplifier module of claim 7, wherein:
the second transmission line assembly includes a first and second transmission lines,
the first one of the metal layers is connected to the first transmission line, and
the second one of the metal layers is connected to the second transmission line.

10. The power amplifier module of claim 6, wherein the electromagnetic shield includes a patterned horizontal portion covering an area that includes at least one of the first transmission line assembly and the second transmission line assembly.

11. The power amplifier module of claim 10, wherein the patterned horizontal portion corresponds to one of the metal layers of the at least one vertical barrier.

12. A power amplifier module, comprising:
a module substrate that includes a plurality of metal layers and a plurality of dielectric layers interleaved between the plurality of metal layers;
a first amplifier coupled to the module substrate and configured to amplify a first signal;
a first transmission line assembly coupled to an output of the first amplifier, wherein the first transmission line assembly is integrally formed with the module substrate from one or more first patterned portions of one or more of the plurality of metal layers;
a second amplifier coupled to the module substrate and configured to amplify a second signal;
a second transmission line assembly coupled to an output of the second amplifier, wherein the second transmission line assembly is integrally formed with the module substrate from one or more second patterned portions of one or more of the plurality of metal layers; and
an electromagnetic shield between the first transmission line assembly and the second transmission line assembly and integrally formed with the module substrate, wherein the electromagnetic shield includes at least one conductive vertical barrier that extends through at least one of the plurality of dielectric layers between adjacent metal layers, and wherein the electromagnetic shield is arranged to shield the first transmission line assembly from the second transmission line assembly, and wherein the first transmission line assembly is configured to shift a phase of the first amplified signal by a first phase angle and the second transmission line assembly is configured to shift a phase of the second amplified signal by a second phase angle different from the first phase angle.

13. The power amplifier module of claim 12, wherein:
the first amplifier is arranged along a carrier signal path,
the second amplifier is arranged along a peaking signal path, and
the carrier and peaking signal paths are in a Doherty amplifier configuration.

14. The power amplifier module of claim 13, further comprising:
a phase adjuster configured to shift the first signal input into the first amplifier by a third phase angle, wherein a sum of the first phase angle and the third phase angle is substantially equal to the second phase angle.

15. The power amplifier module of claim 14, wherein:
the first phase angle is in a first range between 0° and 90°, and
the second phase angle is in a second range between 90° and 180°.

16. The power amplifier module of claim 12, further comprising:
a combiner coupled to outputs of the first transmission line assembly and the second transmission line assembly.

17. The power amplifier module of claim 16, wherein the first transmission line assembly is coupled between the first amplifier and the combiner and wherein the second transmission line assembly is coupled between the second amplifier and the combiner.

18. A power amplifier module, comprising:
a first amplifier configured to amplify a first signal;
a first transmission line assembly coupled to an output of the first amplifier;
a second amplifier configured to amplify a second signal;
a second transmission line assembly coupled to an output of the second amplifier; and
an electromagnetic shield between the first transmission line assembly and the second transmission line assembly, wherein the first transmission line assembly is configured to shift a phase of the first amplified signal by a first phase angle and the second transmission line assembly is configured to shift a phase of the second amplified signal by a second phase angle different from the first phase angle, and wherein the electromagnetic shield includes at least one vertical barrier, the at least one vertical barrier including one or more dielectric layers interleaved between a plurality of metal layers, the plurality of metal layers electrically connected to at least one of the first transmission line assembly and the second transmission line assembly and at least one of the plurality of metal layers includes or is connected to a ground layer.

19. The power amplifier module of claim 18, further comprising:
a number of conductive vias extending through the one or more dielectric layers to connect a first one of the metal layers to a second one of the metal layers.

20. The power amplifier module of claim 19, wherein the first one of the metal layers is connected to the first transmission line assembly and the second one of the metal layers is connected to the second transmission line assembly.

21. The power amplifier module of claim 19, wherein:
the second transmission line assembly includes a first and second transmission lines,
the first one of the metal layers is connected to the first transmission line, and
the second one of the metal layers is connected to the second transmission line.

22. The power amplifier module of claim 18, wherein the electromagnetic shield includes a patterned horizontal portion covering an area that includes at least one of the first transmission line assembly and the second transmission line assembly.

23. The power amplifier module of claim 22, wherein the patterned horizontal portion corresponds to one of the metal layers of the at least one vertical barrier.

* * * * *